(12) United States Patent
Van Tran et al.

(10) Patent No.: US 7,969,239 B2
(45) Date of Patent: Jun. 28, 2011

(54) CHARGE PUMP CIRCUIT AND A NOVEL CAPACITOR FOR A MEMORY INTEGRATED CIRCUIT

(75) Inventors: Hieu Van Tran, San Jose, CA (US); Hung Q. Nguyen, Fremont, CA (US); Thuan T. Vu, San Jose, CA (US); Anh Ly, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 10 days.

(21) Appl. No.: 12/569,832

(22) Filed: Sep. 29, 2009

(65) Prior Publication Data
US 2011/0074492 A1    Mar. 31, 2011

(51) Int. Cl.
*H01L 25/00*    (2006.01)
(52) U.S. Cl. ......................................... 327/564; 327/536
(58) Field of Classification Search .................. 327/535, 327/536, 537, 564, 565, 566
See application file for complete search history.

(56) References Cited

U.S. PATENT DOCUMENTS

| | | | |
|---|---|---|---|
| 5,208,725 A | 5/1993 | Akcasu | |
| 5,583,359 A * | 12/1996 | Ng et al. | 257/306 |
| 5,939,766 A * | 8/1999 | Stolmeijer et al. | 257/534 |
| 7,561,407 B1 * | 7/2009 | Chen et al. | 361/306.1 |

* cited by examiner

*Primary Examiner* — Jeffrey S Zweizig
(74) *Attorney, Agent, or Firm* — DLA Piper LLP (US)

(57) ABSTRACT

A novel capacitor for use in a charge pump circuit has a substrate with a planar surface. A first electrode is in a first plane spaced apart from the planar surface. A second electrode is adjacent to and is spaced apart from the first electrode in the first plane and is capacitively coupled thereto. A third electrode is in a second plane, spaced apart from the first plane and is capacitively coupled to the first electrode. A fourth electrode is adjacent to and spaced apart from the third electrode in the second plane and is capacitively coupled to the third electrode and capacitively coupled to the second electrode. The first and fourth electrodes are electrically connected together and the second and third electrodes are electrically connected together. In addition, a cylindrical shape electrode, and a great wall electrode, and charge pump capacitor-by-pattern-filling is disclosed. A charge pump circuit using the foregoing described capacitor has a plurality of transistors for charging the capacitor and discharging the capacitor thereby increasing the voltage of the charge pump circuit.

14 Claims, 8 Drawing Sheets

CHARGE PUMP CIRCUIT AND A NOVEL CAPACITOR FOR A MEMORY INTEGRATED CIRCUIT

TECHNICAL FIELD

The present invention relates to an improved capacitor for use in a charge pump circuit for a non-volatile memory integrated circuit, and more particularly wherein the capacitor has increased capacitance in a smaller volume.

BACKGROUND OF THE INVENTION

Charge pump circuits are well known in the art. A charge pump circuit is used to pump or increase an input voltage to a higher voltage. Typically they can be found in use in non-volatile memory semiconductor devices. During the operation of program and/or erase, the voltage must be higher than the input voltage. Hence a charge pump circuit is used.

In the prior art, a charge pump circuit uses a capacitor to store or transfer charges. Active elements such a MOS transistors are used to pump charges to and from the capacitor to increase the output voltage of the charge pump circuit. Heretofore, one of the problems of the prior art is that a capacitor takes up much room in an integrated circuit die. For non-volatile memory devices, the non-volatile operating voltages remains essentially unchanged as the technology scaled down to smaller node. As the scale of integration increases for active elements, the passive elements, such as capacitors, remain unscalable due to unchanged operating voltages, and proportionally they take up a greater percentage of the real estate of the integrated circuit die. Hence it is desirable to increase the capacitance of a capacitor in a given volume of space.

SUMMARY OF THE INVENTION

In the present invention, a capacitor comprises a semiconductor substrate having a planar surface. A first electrode is in a first plane spaced apart from the planar surface. A second electrode is adjacent to and spaced apart from the first electrode in the first plane and is capacitively coupled thereto. A third electrode is in a second plane, spaced apart from the first plane and is capacitively coupled to the first electrode. A fourth electrode is adjacent to and spaced apart from the third electrode in the second plane and is capacitively coupled to the third electrode and capacitively coupled to the second electrode. The first and fourth electrodes are electrically connected and the second and third electrodes are electrically connected.

The present invention also relates to a charge pump circuit using the foregoing described novel capacitor. The charge pump circuit comprises a plurality of transistors for charging the foregoing described capacitor and discharging the capacitor thereby increasing the voltage of the charge pump circuit.

DETAILED DESCRIPTION OF THE PREFERRED EMBODIMENT

Figure 1:
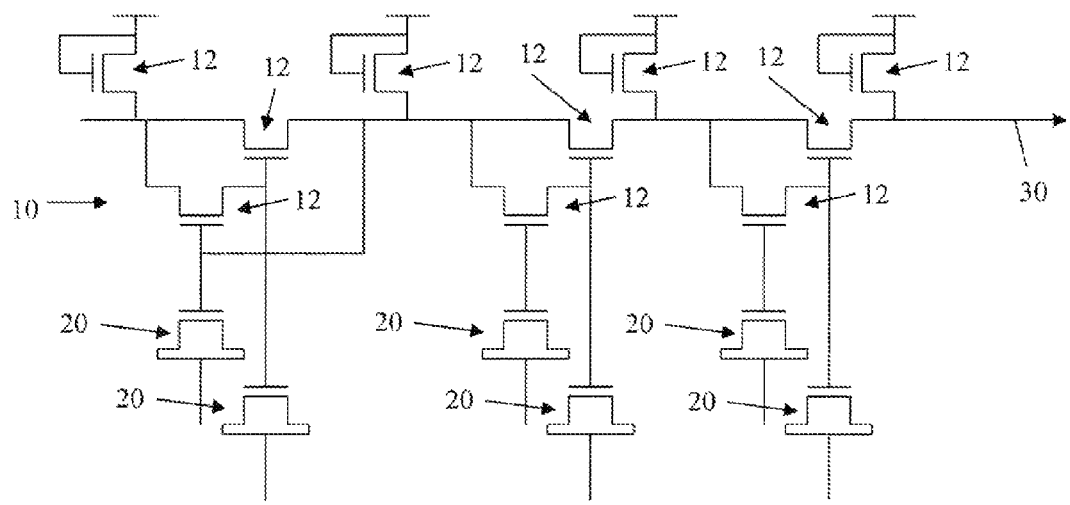
FIG. 1 is a schematic circuit diagram of a charge pump circuit of the prior art.

Referring to FIG. 1 there is shown a schematic circuit diagram of a charge pump circuit 10 of the prior art. The charge pump circuit 10 can be used in a non-volatile floating gate memory device to provide operating voltages for operations such as program, erase or read. Typically, the charge pump circuit 10 is fabricated as part of an integrated circuit device in a semiconductor die. Thus, the charge pump circuit 10 comprises active circuit elements such as transistors 12. In addition, the charge pump circuit 10 comprises passive elements such as capacitors 20. The function of the active elements 12 is to pump charges which are stored in the capacitors 20, in various stages, which ultimately leads to an increase in the output voltage 30 of the charge pump circuit 10. The technique for pumping charges to and from a capacitor to increase the output voltage is well known in the art. Conventional capacitor 20 is typically poly-poly capacitor or high voltage NMOS transistor.

Figure 2:
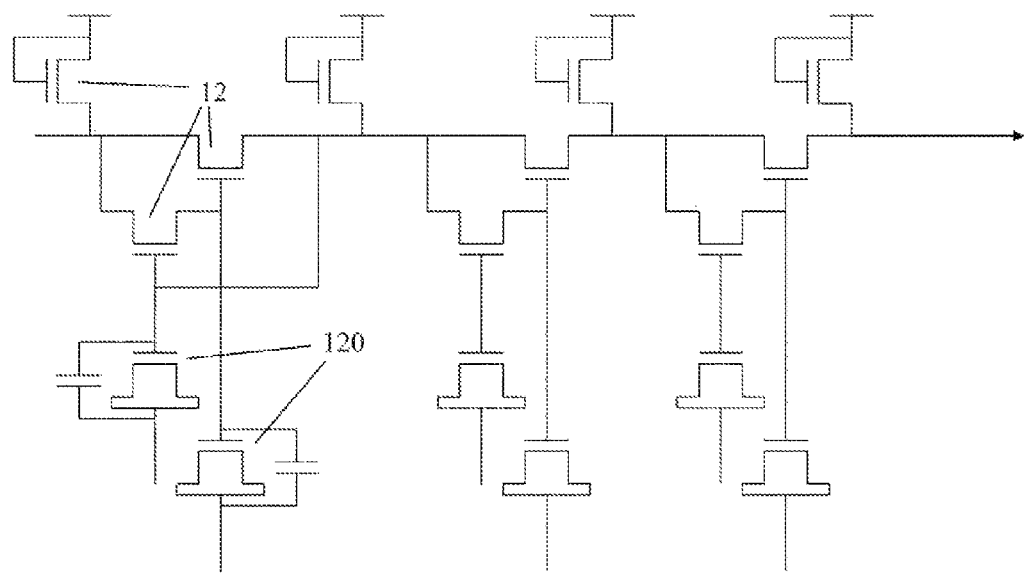
FIG. 2 is a schematic circuit diagram of a charge pump circuit of the present invention.

FIG. 2 shows a schematic circuit diagram of a charge pump circuit 110 of the present invention. The charge pump circuit 110 is similar to the charge pump circuit 10 of the prior art. Thus, like numerals will be used for like parts. The charge pump circuit 110 comprises a plurality of pumping stages, with each pumping stage comprising active elements, such as transistors 12 and capacitors 120 of the present invention, which replace the prior art capacitors 10. Functionally, the capacitor 120 of the first pumping stage can consists of a MOS capacitor and a either PIP (poly-insulator-poly) or MIM (metal-insulator-metal) in parallel. This is to help the first stage operate; because of the high threshold value of the MOS capacitor, the MOS capacitor alone may not be able to turn on the first stage and hence the charge pump circuit 110 may not function. By using a PIP or MIM capacitor in parallel with the MOS capacitor, it helps the charge pump circuit 110 to start and/or function more effectively. Alternatively all stages of the charge pump circuit 110 can utilize the capacitor 120 of the present invention. Alternatively, a MIP (metal-insulator-polysilicon) capacitor can be used in parallel with the MOS capacitor. Finally, a MIPIS (metal-insulator-polysilicon-insulator-silicon) capacitor can also be used instead of the MIP capacitor. Various embodiments of MIPIS, MIP or MIP or a mixture thereof that optimizes the capacitance density are described hereinbelow.

Figure 3:
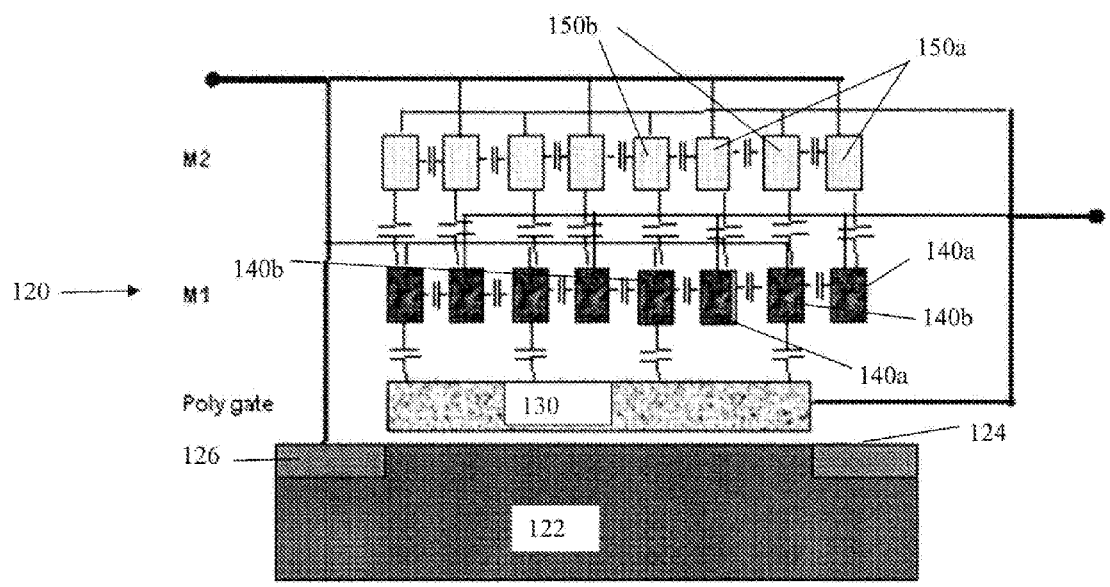
FIG. 3 is a schematic cross sectional view of a first embodiment of the capacitor of the present invention for use with the charge pump circuit shown in FIG. 2.

Referring to FIG. 3, there is shown a cross-sectional view of a first embodiment of a capacitor 120 of the present invention. Because the capacitor 120 can be used with a charge pump circuit, such as circuit 110, which is formed in a semiconductor die, the capacitor 120 has a substrate 122. However, it will be appreciated by those skilled in the art, that the novel capacitor 120 of the present invention need not be formed of any semiconductor substrate 122. As is well known, the substrate 122 has a first conductivity, typically p type so that the active elements 12 can be formed therein. Further, the substrate 122 has a planar surface 124. In the substrate 122 along the planar surface 124 of the substrate 122 is a region 126 of a second conductivity type, such as N. Typically, this is either a source or drain 126 and is formed to fabricate the active elements 12. Above the substrate 122 and insulated therefrom is a polysilicon layer 130. The layer of polysilicon 130 is also used by semiconductor processing to form gates to transistors 12. The polysilicon layer 130 is vertically capacitively coupled to the planar surface 124 and part of overlapping regions 126 diffusing underneath the polysilicon layer 130. Between the polysilicon layer 130 and the surface 124 is an oxide layer, typically same as gate oxide of the transistor 12, such as silicon oxide or hafnium oxide. The regions 126 provides N type carrier for the surface 124 when the polysilicon layer 130 is positive potential versus the surface 124. In another planar layer, spaced apart from the polysilicon layer 130 is a first metal layer 140. The first metal layer 140 has two electrically separate electrodes: a plurality of first electrodes 140a and a plurality of second electrodes 140b. All of the first electrodes 140a are electrically connected together and all of the second electrodes 140b are electrically connected together. The second electrodes 140b are adjacent to and spaced apart from the first electrodes 140a, and lie in the same plane 140. The region between the first electrodes 140a and the second electrodes 140b is filled with an insulating material (oxide, oxinitride, air) and thus, the second electrodes 140b are laterally capacitively coupled to the first electrodes 140a. The second electrodes 140b are vertically capacitively coupled to the polysilicon layer 130. Alternatively layer 140 can be implemented as a polysilicon layer.

In another planar layer, spaced apart from the first metal layer 140 and insulated therefrom is a second metal layer 150 The second metal layer 150 has two electrically separate electrodes: a plurality of third electrodes 150a and a plurality of fourth electrodes 150b. All of the third electrodes 150a are electrically connected together and all of the fourth electrodes 150b are electrically connected together. The fourth electrodes 150b are adjacent to and spaced apart from the third electrodes 150a, and lie in the same plane 150. The region between the third electrodes 150a and the fourth electrodes 150b is filled with an insulating material and thus, the fourth electrodes 150b are laterally capacitively coupled to the third electrodes 150a. In addition, the third electrodes 150a are "above" the first electrodes 140a, and are capacitively coupled thereto. Finally, the fourth electrodes 150b are "above" the second electrodes 140b and are capacitively coupled thereto.

The capacitor 120 of the present invention further has the drain/source region 126 electrically connected to the second electrodes 140b and electrically connected to the third electrodes 150a. In addition, the polysilicon layer 130 is electrically connected to the first electrodes 140a and electrically connected to the fourth electrodes 150b.

The total capacitance of the capacitor 120 of the present invention is the sum of the following capacitances: 1) the capacitance between the polysilicon layer 130 and the second electrodes 140b; 2) the capacitance between the first electrodes 140a and electrodes 140b; 3) the capacitance between the fourth electrodes 150b and the second electrodes 140b; 4) the capacitance between the third electrodes 150a and the first electrodes 140a; 5) the capacitance between the third electrodes 150a and the fourth electrodes 150b; and 6) the capacitance between the polysilicon layer 130 and the surface 124. Since capacitance occurs not only between layers but also within a layer from side-to-side between adjacent electrodes, the overall capacitance is increased in a given volume of space.

Figure 4:
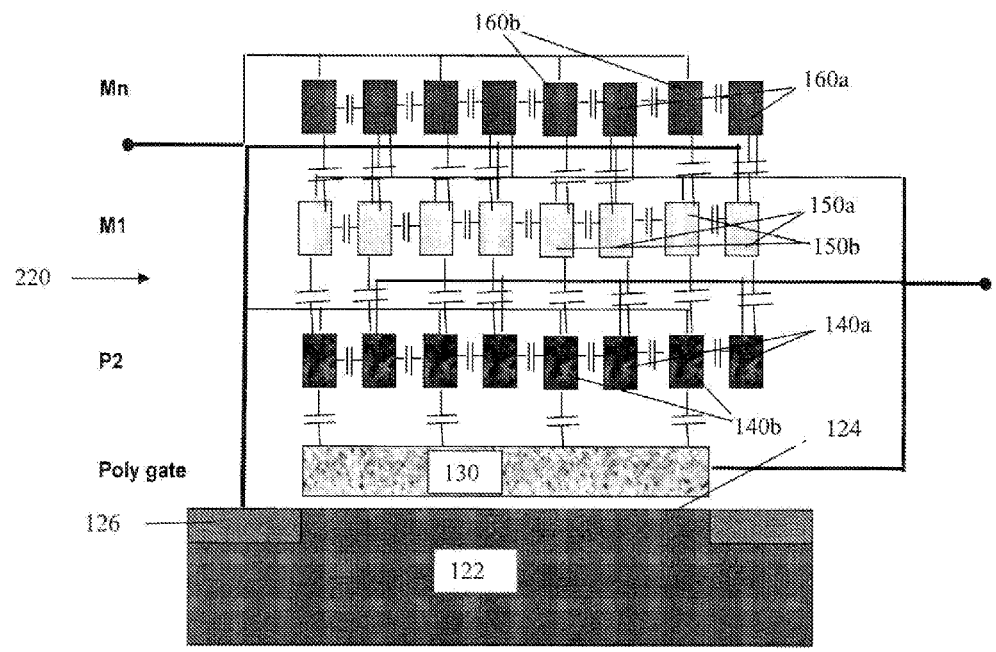
FIG. 4 is a schematic cross sectional view of a second embodiment of the capacitor of the present invention for use with the charge pump circuit shown in FIG. 2.

Referring to FIG. 4 there is shown a cross-sectional view of a second embodiment of a capacitor 220 of the present invention. The capacitor 220 is very similar to the capacitor 120 shown in FIG. 2. Hence like numerals will be used for similar parts. The capacitor 220 has a substrate 122. The substrate 122 has a first conductivity, typically P type so that the active elements 12 can be formed therein. Further, the substrate 122 has a planar surface 124. In the substrate 122 along the planar surface 124 of the substrate 122 is a region 126 of a second conductivity type, such as N. Typically, this is either a source or drain 126 and is formed to fabricate the active elements 12. Above the substrate 122 and insulated therefrom is a first polysilicon layer 130. The first layer of polysilicon 130 is also used by semiconductor processing to form gates to transistors 12. The polysilicon layer 130 is vertically capacitively coupled to the planar surface 124. In another planar layer, spaced apart from the first polysilicon layer 130 and insulated therefrom is a second polysilicon layer 140. The second polysilicon metal layer 140 has two electrically separate electrodes: a plurality of first electrodes 140a and a plurality of second electrodes 140b. All of the first electrodes 140a are electrically connected together and all of the second electrodes 140b are electrically connected together. The second electrodes 140b are adjacent to and spaced apart from the first electrodes 140a, and lie in the same plane 140. The region between the first electrodes 140a and the second electrodes 140b is filled with an insulating material and thus, the second electrodes 140b are laterally capacitively coupled to the first electrodes 140a. The second electrodes 140b are vertically capacitively coupled to the polysilicon layer 130.

In another planar layer, spaced apart from the second polysilicon layer 140 and insulated therefrom is a first metal layer 150. The first metal layer 150 has two electrically separate electrodes: a plurality of third electrodes 150a and a plurality of fourth electrodes 150b. All of the third electrodes 150a are electrically connected together and all of the fourth electrodes 150b are electrically connected together. The fourth electrodes 150b are adjacent to and spaced apart from the third electrodes 150a, and lie in the same plane 150. The region between the third electrodes 150a and the fourth electrodes 150b is filled with an insulating material and thus, the fourth electrodes 150b are laterally capacitively coupled to the third electrodes 150a. In addition, the third electrodes 150a are "above" the first electrodes 140a, and are capacitively coupled thereto. Finally, the fourth electrodes 150b are "above" the second electrodes 140b and are capacitively coupled thereto.

In another planar layer, spaced apart from the first metal layer 150 and insulated therefrom is a second metal layer 160. The second metal layer 160 has two electrically separate electrodes: a plurality of fifth electrodes 160a and a plurality of sixth electrodes 160b. All of the fifth electrodes 160a are electrically connected together and all of the sixth electrodes 160*b* are electrically connected together. The sixth electrodes 160*b* are adjacent to and spaced apart from the fifth electrodes 160*a*, and lie in the same plane 160. The region between the fifth electrodes 160*a* and the sixth electrodes 160*b* is filled with an insulating material and thus, the sixth electrodes 160*b* are laterally capacitively coupled to the fifth electrodes 160*a*. In addition, the fifth electrodes 160*a* are "above" the third electrodes 150*a*, and are capacitively coupled thereto. Finally, the sixth electrodes 160*b* are "above" the fourth electrodes 150*b* and are capacitively coupled thereto The capacitor 220 of the present invention further has the drain/source region 126 electrically connected to the second electrodes 140*b* and electrically connected to the third electrodes 150*a*, and electrically connected to the sixth electrodes 160*b*. In addition, the first polysilicon layer 130 is electrically connected to the first electrodes 140*a* and electrically connected to the fourth electrodes 150*b*, and electrically connected to the fifth electrodes 160*a*.

The total capacitance of the capacitor 220 of the present invention is the sum of the following capacitances: 1) the capacitance between the first polysilicon layer 130 and the second electrodes 140*b*; 2) the capacitance between the first electrodes 140*a* and second electrodes 140*b*; 3) the capacitance between the fourth electrodes 150*b* and the second electrodes 140*b*; 4) the capacitance between the third electrodes 150*a* and the first electrodes 140*a*; 5) the capacitance between the third electrodes 150*a* and the fourth electrodes 150*b*; 6) the capacitance between the third electrodes 150*a* and the fifth electrodes 160*a*; 7) the capacitance between the fourth electrodes 150*b* and the sixth electrodes 160*b*; 8) the capacitance between the fifth electrodes 160*a* and the sixth electrodes 160*b*; and 9) the capacitance between the polysilicon layer 130 and the surface 124. Since capacitance occurs not only between layers abut also within a layer from side-to-side between adjacent electrodes, the overall capacitance is increased in a given volume of space.

Figure 5:
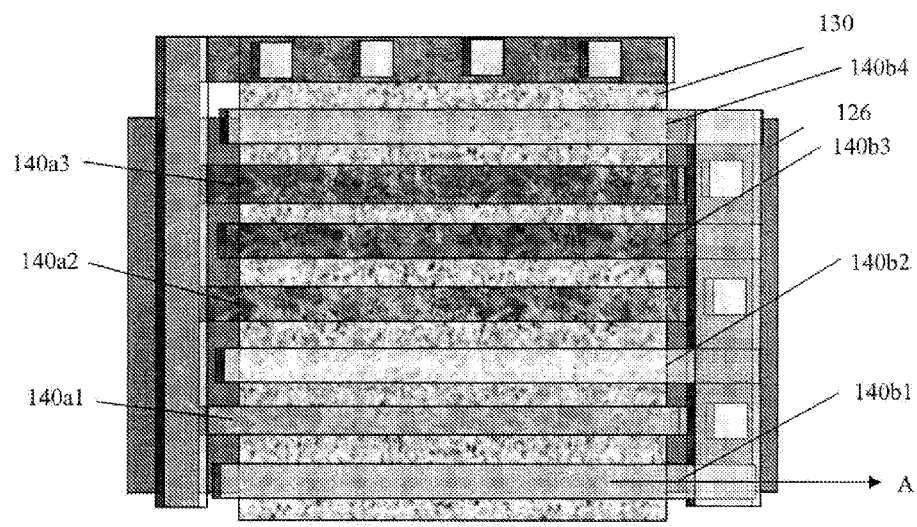
FIG. 5 is a top view of a first embodiment of the electrodes for use in one plane of the capacitor of the present invention shown in either FIG. 3 or FIG. 4.

Referring to FIG. 5, there is shown a top view of a first embodiment of the shape of the electrodes that can be used in one layer of the capacitor of the present invention. The electrodes shown in FIG. 5 can be used for electrodes 140*a*, 140*b*, 150*a*, 150*b*, 160*a*, or 160*b*, and can be used in the capacitor 120 or 220. Therefore, for purpose of discussion only, the first embodiment shown in FIG. 5 shall be referred to as first electrodes 140*a* and second electrodes 140*b*. In the first embodiment of the electrodes 140*a* and 140*b*, the first electrode 140*a* comprises a plurality of elongated interdigits, e.g. 140*a*1, 140*a*2, and 140*a*3, spaced apart from one another but electrically connected at one end. The interdigits 140*a*1, 140*a*2, and 140*a*3 extend in a first direction (shown by the arrow A) and are substantially parallel to one another. The second electrode 140*b* also comprises a plurality of elongated interdigits, e.g. 140*b*1, 140*b*2, and 140*b*3, spaced apart from one another but electrically connected at one end. The interdigits 140*b*1, 140*b*2, and 140*b*3 also extend in the first direction A and are substantially parallel to one another, with each interdigit 140*b* between a pair of interdigits 140*a* of the first electrode 140*a*. Each interdigit 140*b* of the second electrode 140*b* is parallel to and spaced apart from its adjacent interdigit 140*a* of the first electrode 140*a*, thereby being capacitively coupled thereto in a lateral direction.

Figure 6:
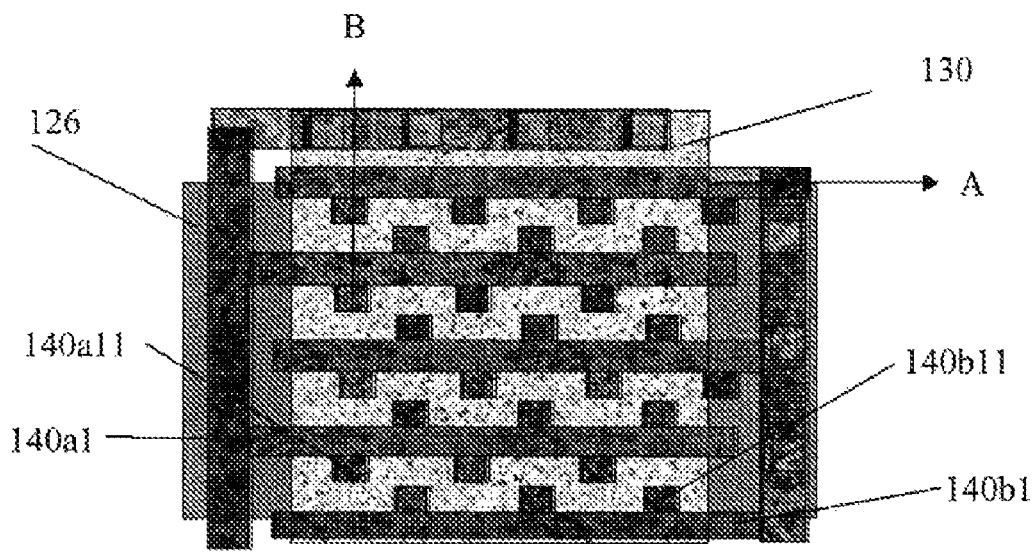
FIG. 6 is a top view of a second embodiment of the electrodes for use in one plane of the capacitor of the present invention shown in either FIG. 3 or FIG. 4.

Referring to FIG. 6, there is shown a top view of a second embodiment of the shape of the electrodes that can be used in one layer of the capacitor of the present invention. Again, the electrodes shown in FIG. 6 can be used for electrodes 140*a*, 140*b*, 150*a*, 150*b*, 160*a*, or 160*b*, and can be used in the capacitor 120 or 220. Therefore, for purpose of discussion only, the second embodiment shown in FIG. 6 shall be referred to as first electrodes 140*a* and second electrodes 140*b*. In the second embodiment of the electrodes 140*a* and 140*b*, the first electrode 140*a* comprises a plurality of elongated interdigits, e.g. 140*a*1, 140*a*2, and 140*a*3, spaced apart from one another but electrically connected at one end. The interdigits 140*a*1, 140*a*2, and 140*a*3 extend in a first direction (shown by the arrow A) and are substantially parallel to one another. However, unlike the first embodiment of the electrode 140*a* shown in FIG. 5, the second embodiment of the electrode 140*a*, shown in FIG. 6 further has a plurality of fingers, e.g. 140*a*11, extending from each interdigit 140*a*1, 140*a*2, and 140*a*3, in a second direction (shown by the arrow B) substantially perpendicular to the first direction A. The second electrode 140*b* also comprises a plurality of elongated interdigits, e.g. 140*b*1, 140*b*2, and 140*b*3, spaced apart from one another but electrically connected at one end. The interdigits 140*b*1, 140*b*2, and 140*b*3 also extend in the first direction A and are substantially parallel to one another, with each interdigit 140*b* between a pair of interdigits 140*a* of the first electrode 140*a*. Each interdigit 140*b* of the second electrode 140*b* is parallel to and spaced apart from its adjacent interdigit 140*a* of the first electrode 140*a*, thereby being capacitively coupled thereto in a lateral direction. Furthermore, each of the second electrode interdigits 140*b*1, 140*b*2 and 140*b*3 also has a plurality of fingers, e.g. 140*b*11, extending from each interdigit 140*b*1, 140*b*2, and 140*b*3, in the second direction B. Further, each of the fingers, e.g. 140*b*11, of the second electrode 140*b* extend in the second direction B between a pair of fingers, e.g. 140*a*11, of the interdigits 140*a* of the first electrode 140*a*.

Figure 7:
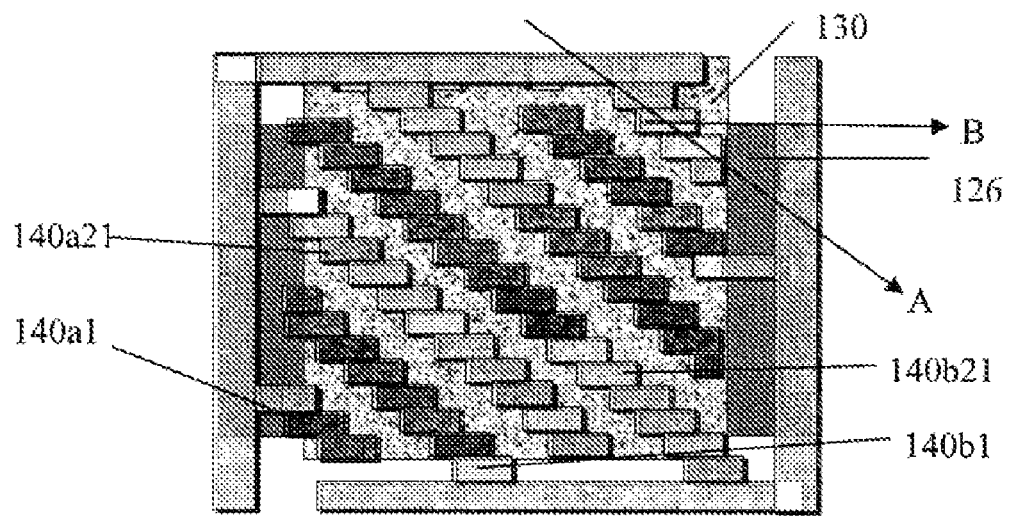
FIG. 7 is a top view of a third embodiment of an electrode for use in the capacitor of the present invention shown in either FIG. 3 or FIG. 4.

Referring to FIG. 7, there is shown a top view of a third embodiment of the shape of the electrodes that can be used in one layer of the capacitor of the present invention. Again, the electrodes shown in FIG. 6 can be used for electrodes 140*a*, 140*b*, 150*a*, 150*b*, 160*a*, or 160*b*, and can be used in the capacitor 120 or 220. Therefore, for purpose of discussion only, the third embodiment shown in FIG. 6 shall be referred to as first electrodes 140*a* and second electrodes 140*b*. In the third embodiment of the electrodes 140*a* and 140*b*, the first electrode 140*a* comprises a plurality of elongated interdigits, e.g. 140*a*1, 140*a*2, and 140*a*3, spaced apart from one another but electrically connected at one end. The interdigits 140*a*1, 140*a*2, and 140*a*3 extend in a first direction (shown by the arrow A) and are substantially parallel to one another. Similar to the second embodiment shown in FIG. 6, each interdigit, e.g. 140*a*2, has a plurality of fingers, e.g. 140*a*21, extending from each interdigit 140*a*1, 140*a*2, and 140*a*3, in a second direction (shown by the arrow B) at an angle to the first direction A. The second electrode 140*b* also comprises a plurality of elongated interdigits, e.g. 140*b*1, 140*b*2, and 140*b*3, spaced apart from one another but electrically connected at one end. The interdigits 140*b*1, 140*b*2, and 140*b*3 also extend in the first direction A and are substantially parallel to one another, with each interdigit 140*b* between a pair of interdigits 140*a* of the first electrode 140*a*. Each interdigit 140*b* of the second electrode 140*b* is parallel to and spaced apart from its adjacent interdigit 140*a* of the first electrode 140*a*, thereby being capacitively coupled thereto in a lateral direction. Furthermore, each of the second electrode interdigits 140*b*1, 140*b*2 and 140*b*3 also has a plurality of fingers, e.g. 140*b*21, extending from each interdigit 140*b*1, 140*b*2, and 140*b*3, in the second direction B. In the embodiment, the angle between direction A and B is substantially equal to 45 degrees.

Figure 8:
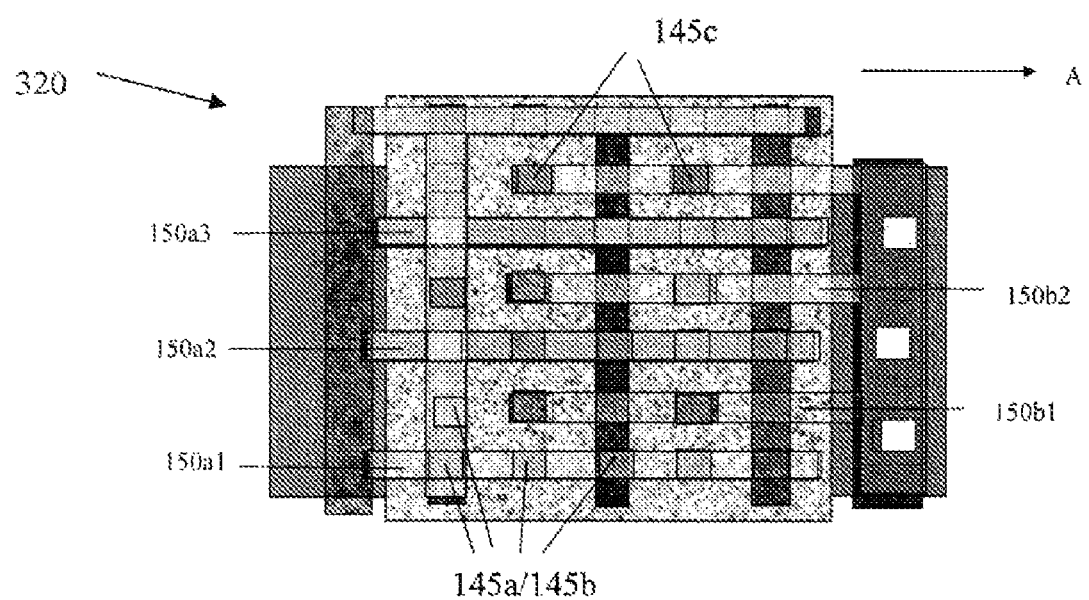
FIG. 8 is a top view of a third embodiment of the capacitor of the present invention for use with the charge pump circuit shown in FIG. 2.

Referring to FIG. 8, there is shown a top view of a third embodiment of the capacitor 320 of the present invention. The capacitor 320 is similar to the capacitor 110 or 220 in that the capacitor 320 "sits" above the polysilicon layer 130, which is above the substrate 122 shown in FIGS. 3 and 4. A first embodiment of the various layers of the electrodes for the capacitor 320 is shown in FIG. 9A.

Figure 9A:
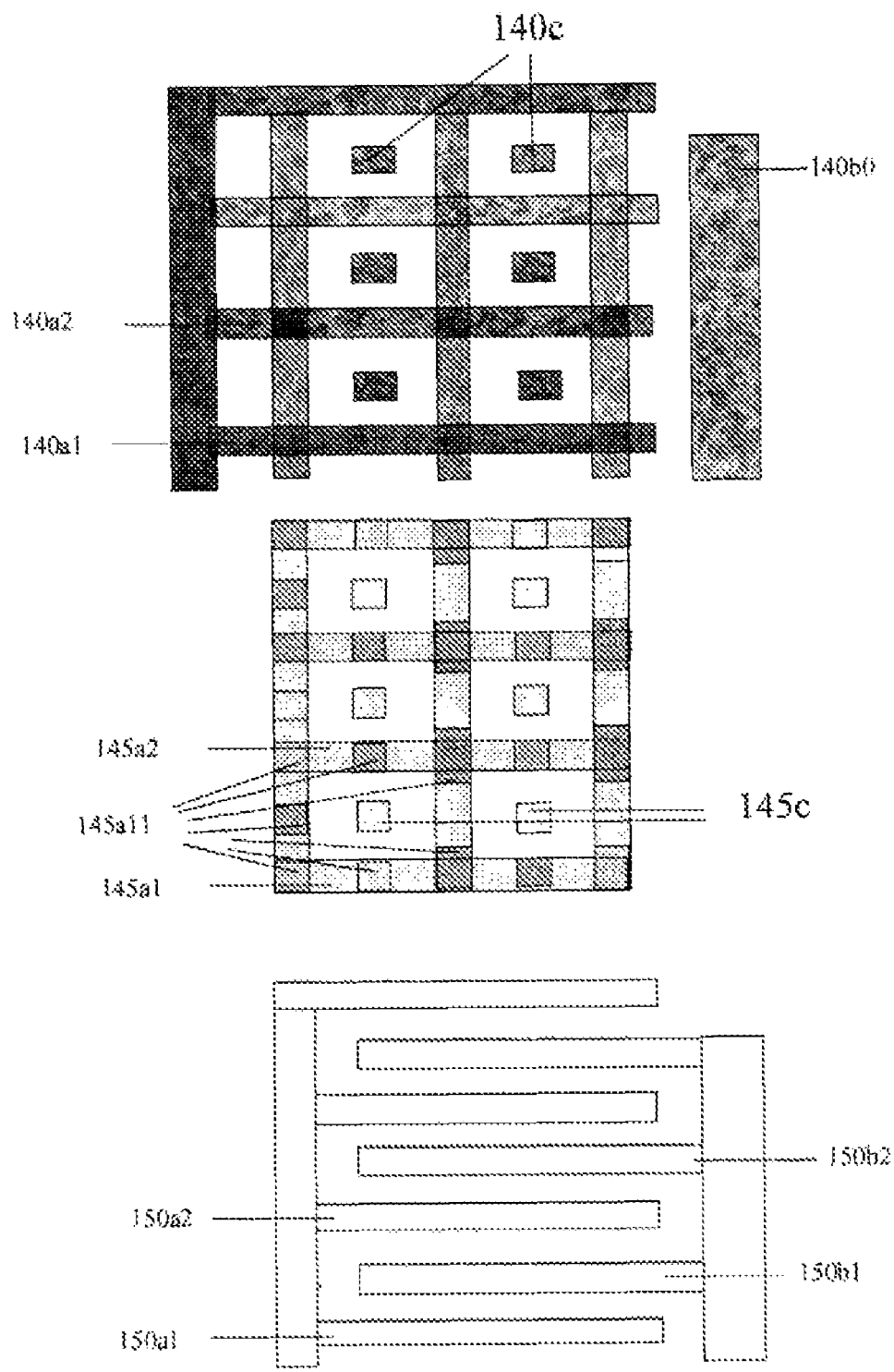
FIGS. 9A and 9B are top views of the first and second embodiments of the electrodes for use in various planes of the third embodiment of the capacitor of the present invention shown in FIG. 8.

Referring to FIG. 9A, there is shown three layers (140, 145 and 150) of electrodes 140, 145 and 150. In one embodiment the layers 140, 145, and 150 can be polysilicon, contact, and metal respectively. Alternatively layers 140, 145, and 150 can be metal, via, and metal respectively. In the layer 140, a plurality of electrodes 140a are spaced apart and parallel to one another in a first direction. A plurality of electrodes 140b are also spaced apart and parallel to one another in a second direction which is substantially perpendicular to the first direction. The electrodes 140a and electrodes 140b are electrically connected together to form rectangular or square patterns with a contact 140c in the middle thereof, insulated from the surrounding connected electrodes 140a and 140b. The center electrode 140c is insulated from the electrodes 140a and 140b by an insulating material (such as oxide or oxynitride). Thus, the center electrode 140c is laterally capacitively coupled to the surrounding electrodes 140a and 140b. The electrodes in the layer 145 are similar to the electrodes 140a, 140b, and 140c in the layer 140. The electrodes in the layer 145 comprises a plurality of parallel spaced apart electrodes 145a extending in the first direction. The electrodes in the layer 145 also comprises a plurality of parallel spaced apart electrodes 145b extending in the second direction which is substantially perpendicular to the first direction. The electrodes 145a and electrodes 145b are electrically connected together to form rectangular or square patterns with a contact 145c in the middle thereof, insulated from the surrounding connected electrodes 145a and 145b. The center electrode 145c is insulated from the electrodes 145a and 145b by an insulating material (such as oxide or oxynitride). Thus, the center electrode 145c is laterally capacitively coupled to the surrounding electrodes 145a and 145b. Finally, the electrodes in the layer 150 are substantially similar to the electrodes shown in FIG. 5. Thus, the electrodes in layer 150 comprises a plurality of elongated interdigits, e.g. 150a1, 150a2, and 150a3, spaced apart from one another but electrically connected at one end. The interdigits 150a1, 150a2, and 150a3 extend in a first direction and are substantially parallel to one another. The second electrode 150b also comprises a plurality of elongated interdigits, e.g. 150b1, 150b2, and 150b3, spaced apart from one another but electrically connected at one end. The interdigits 150b1, 150b2, and 150b3 also extend in the first direction and are substantially parallel to one another, with each interdigit 150b between a pair of interdigits 150a of the first electrode 150a. Each interdigit 150b of the second electrode 150b is parallel to and spaced apart from its adjacent interdigit 150a of the first electrode 150a, thereby being capacitively coupled thereto in a lateral direction.

The manner in which the layers 140, 145 and 150 are connected together is as follows. The electrodes 140a and 140b which are connected together to form a rectangular or square pattern is substantially the same pattern as the electrodes 145a and 145b which are connected together in layer 145. Thus, the electrodes 140a/140b in the layer 140 are electrically connected to the electrodes 145a/145b in the layer 145, and to the electrode 150a in the layer 150. The center electrodes 140c and 145c are electrically connected together and to the electrode 150b in the layer 150. Thus, viewed from the perspective of layer 150 as the top most layer, and viewing the connection, one sees that electrode 150b is electrically connected to the center electrodes 140c and 145c of the layers 145 and 140, and the electrode 150a is electrically connected to the electrodes 145a/145b and 140a/ 140b. The capacitance of the capacitor 320 consists of (1) capacitance between pieces electrodes 140c/145c and the surrounding electrodes 140a/b and 145a/b, (2) capacitance between electrode 150a and electrode 150b. (3) capacitance between the electrode 140a and 140b in layer 140 and layer 130, and (4) capacitance between layer 130 and layer 124.

Figure 9B:
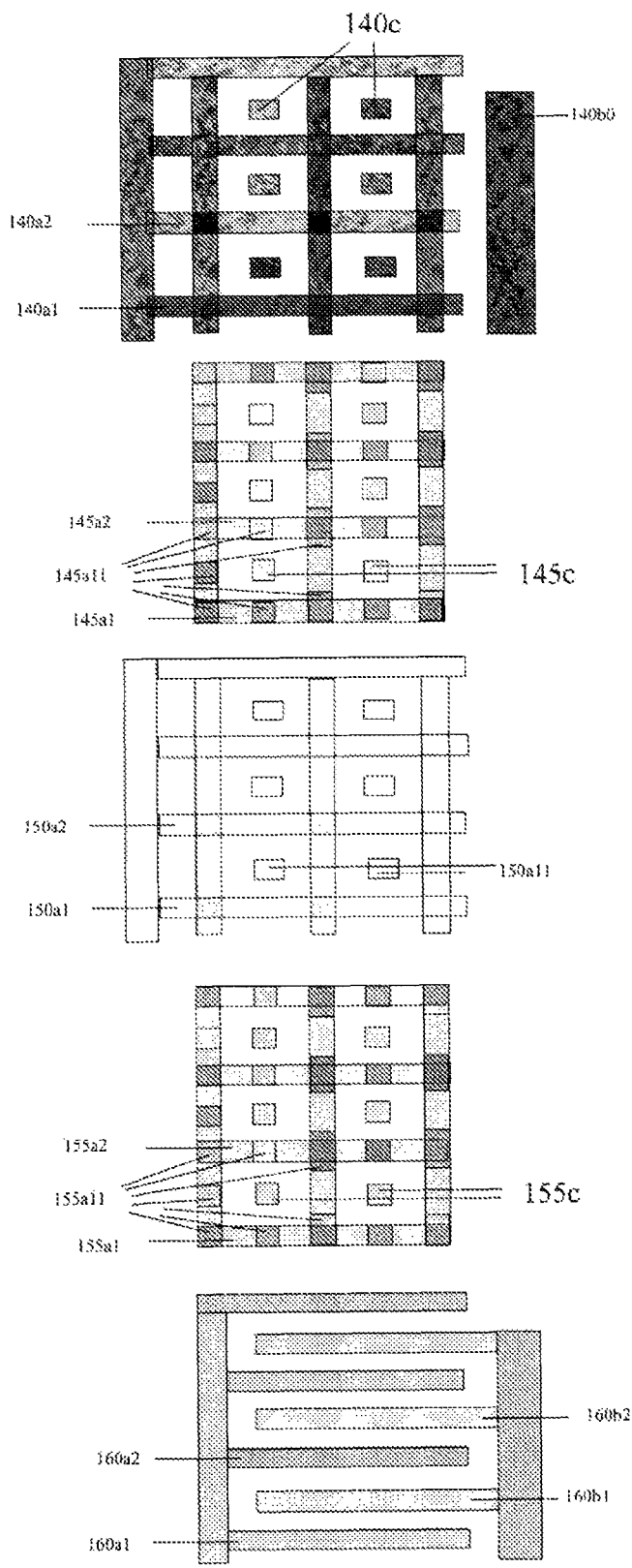

Referring to FIG. 9B there is shown another embodiment for the electrodes that can be used with the capacitor 320. The embodiment of the electrodes shown in FIG. 9B is very similar to the electrodes shown in FIG. 9A. The electrodes in FIG. 9B comprises three layers: 140, 145, 150, 155, and 160. In one embodiment, the layers 140, 145, 150, 155 and 160 can be polysilicon, contact, metal 1, via, and metal 2, respectively. Alternatively layers 140, 145, 150, 155 and 160 can be metal 1, via 1, metal 2, via 2, and metal 3, respectively. The layers 140 and 145 are similar to the layers 140 and 145, respectively, shown in FIG. 9A. The layers of electrodes 150, 155 and 160 are similar to the layers 140, 145 and 150, respectively shown in FIG. 9A. The connection of the layers results in the center electrodes of each layer being electrically connected and capacitively coupled to the surrounding electrodes that form a square or rectangular shape—same as the electrodes shown in FIG. 9A.

Figure 10:
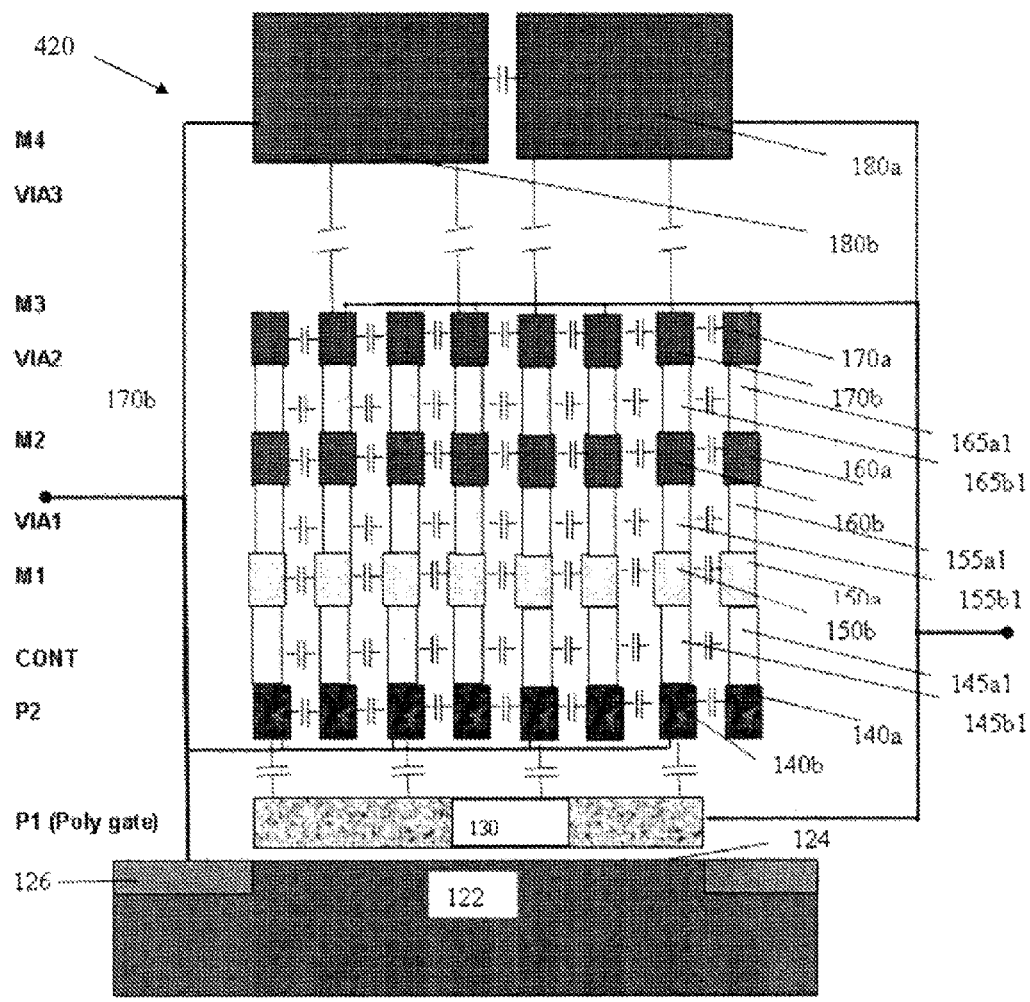
FIG. 10 is a cross sectional view of a fourth embodiment of the capacitor of the present invention for use with the charge pump circuit shown in FIG. 2.

Referring to FIG. 10, there is shown a 'great wall' capacitor 420 structure. The capacitor 420 is similar to the capacitor 320 except there are more layers. Thus, the capacitor 420 has layers 140, 145, 150, 155, 160, 165 and 170, with layers 140, 150, 160 and 170 similar to the layers 140 and 150 of the capacitor 320 shown in FIG. 9B. The layers 145, 155 and 165 of the capacitor 420 are similar to the layers 145 and 155 shown in FIG. 9B. Finally, the top most layer 180 for the capacitor 420 is similar to the layer 160 shown in FIG. 9B. Electrodes 140a, 150a, 160a, 170a are electrically connected together vertically through a via structure 145a1, 155a1, 165a1 and also connecting to electrode 180a. Similarly electrodes 140b, 150b, 160b, 170b are electrically connected together vertically through a via structure 145b1, 155b1, 165b1 and also connecting to electrode 180b. Electrode 180a and 180b are top level metal layers. Alternatively, layers 140, 145, 150, 155, 160, 165 and 170 can be constructed similar to layer 150 of capacitor 320 shown in FIG. 8 with two parallel electrodes in each layer and with via structures 145a1, 155a1, 165a1 connecting vertically the electrodes between the layers.

The capacitance of the capacitor 420 shown in FIG. 10 consists of (1) capacitance between electrodes 140a, 145a, 150a, 155a, 160a, 165a, 170a and electrodes 140b, 145b, 150b, 155b, 160b, 165b, 170b, (2) capacitance between electrode 180a and 170b, between electrode 180b and 170a, and between electrode 180a and 180b. (3) capacitance between electrode 140b and layer 130, and (4) capacitance between layer 130 and layer 124.

In the prior art, after a layer, such as polysilicon, insulator or metal is deposited or formed, pattern filling is used to render that layer more planar, so that subsequent processing, such as etching or Chemical Mechanical Polishing (CMP) can be performed. The mechanism of pattern filling is to fill in certain shapes (such 2 um×2 um or 5 um×5 um square shape or 2 um×5 um rectangular shape) in empty area so the layer pattern looks more uniform (meeting certain density requirement such as between 40-80%). In short, material of the same layer (such as polysilicon, insulator or metal) is used to fill empty areas so as to render the layer more planar. The pattern filling of the prior art fills these empty areas as "dummy" areas, with no circuit connections.

In the present invention, the pattern filling is used to create capacitors of the present invention for use in the charge pump circuit of the present invention. Instead of just filling all dummy patterns, a filling algorithm fills in a predetermined capacitor pattern in suitable areas in addition to dummy pattern (capacitor pattern similar to those described here, size such as 5 um×5 um in available suitable area) for other areas. A routing algorithm is then used to connect these pattern filled formed capacitors to the charge pump control circuitry for the charge pump circuit. This connection could also be done manually by planning the blocks placement appropriately to take care of the filling routing channel.

Finally, it should be appreciated that the capacitor 120, 220, 320 or 420 of the present invention can be used in the charge pump circuit 10 of the prior art, such as that shown in FIG. 1. Such charge pump circuit can be used in non-volatile memory devices of the floating gate type. As is also well known, a non-volatile memory device is fabricated in a semiconductor substrate 122, along with bonding pads to connect electrically to the memory device. Between the bonding pad and the substrate, however, that portion of the semiconductor "real estate" is typically wasted, in that no active or passive devices are constructed in that region. Thus, in another aspect of the present invention, the capacitor 120, 220, 320 or 420 of the present invention can be positioned in the region above the planar surface 124 of the substrate 122, and below the bonding pad to further save space.

What is claimed is:

1. A charge pump circuit for use in an integrated circuit die, said charge pump circuit comprising:
   a capacitor;
   a plurality of transistors for charging said capacitor and discharging said capacitor thereby increasing the voltage of the charge pump circuit; and
   said capacitor comprises:
   a first electrode in a first plane, wherein said first electrode comprises a plurality of first interdigital elements electrically connected to one another;
   a second electrode adjacent to and spaced apart from the first electrode in the first plane and capacitively coupled thereto, wherein said second electrode comprises a plurality of second interdigital elements electrically connected to one another, with each second interdigital element between a pair of first interdigital elements;
   a third electrode in a second plane, spaced apart from the first plane and capacitively coupled to the first electrode, wherein said third electrode comprises a plurality of third interdigital elements electrically connected to one another, with each third interdigital element capacitively coupled to a different first interdigital element; and
   a fourth electrode adjacent to and spaced apart from the third electrode in the second plane and capacitively coupled to the third electrode and capacitively coupled to the second electrode, wherein said fourth electrode comprises a plurality of fourth interdigital elements electrically connected to one another, with each fourth interdigital element between a pair of third interdigital elements, and with each fourth interdigital element capacitively coupled to a different second interdigital element;
   wherein said first and fourth electrodes are electrically connected and said second and third electrodes are electrically connected;
   wherein said integrated circuit die further comprises:
   a semiconductor substrate having a first conductivity, said substrate having a planar surface;
   a first region of a second conductivity on said planar surface of said substrate;
   wherein said first region is electrically connected to said first electrode.

2. The charge pump circuit of claim 1 further comprising:
   a planar electrode above the planar surface of said substrate, and insulated therefrom;
   wherein the planar electrode is electrically connected to said second electrode.

3. The charge pump circuit of claim 2 further comprising a bonding pad above the planar surface of said substrate;
   wherein said capacitor is positioned between the bonding pad and the planar surface of said substrate.

4. The charge pump circuit of claim 2 wherein said planar electrode is made of polysilicon and wherein each of said first electrode, second electrode, third electrode and fourth electrode is made of metal.

5. The charge pump circuit of claim 1, wherein each of said plurality of first interdigital elements are parallel to one another in a first direction; wherein each of said plurality of second interdigital elements are parallel to one another in said first direction; wherein each of said plurality of third interdigital elements are parallel to one another in said first direction; and wherein each of said plurality of fourth interdigital elements are parallel to one another in said first direction.

6. The charge pump circuit of claim 5
   wherein each of said first interdigital elements further comprises a plurality of first fingers extending in a second direction not parallel to the first direction from a first interdigital element;
   wherein each of said second interdigital elements further comprises a plurality of second fingers extending in said second direction from a second interdigital element;
   wherein each of said third interdigital elements further comprises a plurality of third fingers extending in said second direction from a third interdigital element;
   wherein each of said fourth interdigital elements further comprises a plurality of fourth fingers extending in said second direction from a fourth interdigital element.

7. The charge pump circuit of claim 6
   wherein each of said first fingers are spaced apart from one;
   wherein each of said second fingers are spaced apart from one another with a second finger between a pair of first fingers;
   wherein each of said third fingers are spaced apart from one;
   wherein each of said fourth fingers are spaced apart from one another with a fourth finger between a pair of third fingers; and
   wherein said second direction is substantially perpendicular to said first direction.

8. A capacitor comprising:
   a semiconductor substrate having a planar surface;
   a first electrode in a first plane spaced apart from the planar surface wherein said first electrode comprises a plurality of first interdigital elements electrically connected to one another;
   a second electrode adjacent to and spaced apart from the first electrode in the first plane and capacitively coupled thereto, wherein said second electrode comprises a plurality of second interdigital elements electrically connected to one another, with each second interdigital element between a pair of first interdigital elements;
   a third electrode in a second plane, spaced apart from the first plane and capacitively coupled to the first electrode, wherein said third electrode comprises a plurality of third interdigital elements electrically connected to one another, with each third interdigital element capacitively coupled to a different first interdigital element; and a fourth electrode adjacent to and spaced apart from the third electrode in the second plane and capacitively coupled to the third electrode and capacitively coupled to the second electrode, wherein said fourth electrode comprises a plurality of fourth interdigital elements electrically connected to one another, with each fourth interdigital element between a pair of third interdigital elements, and with each fourth interdigital element capacitively coupled to a different second interdigital element;

wherein said first and fourth electrodes are electrically connected and said second and third electrodes are electrically connected;

wherein said substrate has a first conductivity;

a first region of a second conductivity on said planar surface of said substrate;

wherein said first region is electrically connected to said first electrode.

9. The capacitor of claim 8 further comprising:

a planar electrode above the planar surface of said substrate, and insulated therefrom;

wherein the planar electrode is electrically connected to said second electrode.

10. The capacitor of claim 9 further comprising a bonding pad above the planar surface of said substrate;

wherein said capacitor is positioned between the bonding pad and the planar surface of said substrate.

11. The capacitor of claim 9 wherein said planar electrode is made of polysilicon and wherein each of said first electrode, second electrode, third electrode and fourth electrode is made of metal.

12. The capacitor of claim 8, wherein each of said plurality of first interdigital elements are parallel to one another in a first direction; wherein each of said plurality of second interdigital elements are parallel to one another in said first direction; wherein each of said plurality of third interdigital elements are parallel to one another in said first direction; and wherein each of said plurality of fourth interdigital elements are parallel to one another in said first direction.

13. The capacitor of claim 12 wherein each of said first interdigital elements further comprises a plurality of first fingers extending in a second direction not parallel to the first direction from a first interdigital element;

wherein each of said second interdigital elements further comprises a plurality of second fingers extending in said second direction from a second interdigital element;

wherein each of said third interdigital elements further comprises a plurality of third fingers extending in said second direction from a third interdigital element;

wherein each of said fourth interdigital elements further comprises a plurality of fourth fingers extending in said second direction from a fourth interdigital element.

14. The capacitor of claim 13 wherein each of said first fingers are spaced apart from one;

wherein each of said second fingers are spaced apart from one another with a second finger between a pair of first fingers;

wherein each of said third fingers are spaced apart from one;

wherein each of said fourth fingers are spaced apart from one another with a fourth finger between a pair of third fingers; and wherein said second direction is substantially perpendicular to said first direction.

* * * * *